US012588307B2

(12) United States Patent
Sulfridge et al.

(10) Patent No.: US 12,588,307 B2
(45) Date of Patent: Mar. 24, 2026

(54) IMAGE SENSOR WITH A BOND PAD

(71) Applicant: SEMICONDUCTOR COMPONENTS INDUSTRIES, LLC, Phoenix, AZ (US)

(72) Inventors: Marc Allen Sulfridge, Boise, ID (US); William Crofoot, Nampa, ID (US); Swarnal Borthakur, Boise, ID (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 437 days.

(21) Appl. No.: 18/172,730

(22) Filed: Feb. 22, 2023

(65) Prior Publication Data

US 2024/0038800 A1 Feb. 1, 2024

Related U.S. Application Data

(60) Provisional application No. 63/369,684, filed on Jul. 28, 2022.

(51) Int. Cl.
H10F 39/00 (2025.01)
H10F 39/18 (2025.01)

(52) U.S. Cl.
CPC ....... H10F 39/8057 (2025.01); H10F 39/024 (2025.01); H10F 39/8063 (2025.01); *H10F 39/182* (2025.01)

(58) Field of Classification Search
None
See application file for complete search history.

(56) References Cited

U.S. PATENT DOCUMENTS

| | | | |
|---|---|---|---|
| 10,165,211 B1 | 12/2018 | Borthakur et al. | |
| 11,456,327 B2 | 9/2022 | Jin et al. | |
| 2012/0018832 A1* | 1/2012 | Cooney, III | G06F 30/30 |
| | | | 257/E31.127 |
| 2013/0082163 A1* | 4/2013 | Chen | H10F 39/8063 |
| | | | 29/458 |
| 2015/0102448 A1 | 4/2015 | Sato | |
| 2016/0300962 A1* | 10/2016 | Borthakur | H04N 23/10 |
| 2017/0221951 A1* | 8/2017 | Zheng | H10F 39/024 |
| 2017/0301715 A1 | 10/2017 | Cheng et al. | |
| 2018/0190690 A1* | 7/2018 | Lee | H10F 39/182 |
| 2018/0219046 A1* | 8/2018 | Yamaguchi | H10K 30/30 |
| 2021/0057478 A1 | 2/2021 | Lee et al. | |
| 2021/0175286 A1* | 6/2021 | Park | H10F 39/8053 |
| 2022/0359596 A1* | 11/2022 | Kim | H10F 39/8057 |
| 2022/0375983 A1* | 11/2022 | Kang | H10F 39/8063 |

* cited by examiner

*Primary Examiner* — Nilufa Rahim
(74) *Attorney, Agent, or Firm* — Slayden Grubert Beard PLLC

(57) ABSTRACT

An image sensor may include a sensor chip that is bonded to an application-specific integrated circuit (ASIC) chip. A bond pad for the image sensor may be formed in the ASIC chip and exposed through a trench in the sensor chip. The image sensor may include a conductive light shield at a periphery of the image sensor to shield optically black pixels. An opaque layer may be formed over the conductive light shield to mitigate reflections off the conductive light shield. An anti-reflective layer may be formed over the pixel array. The anti-reflective layer may have a different thickness over the pixel array than in the trench for the bond pad.

20 Claims, 12 Drawing Sheets

IMAGE SENSOR WITH A BOND PAD

This application claims the benefit of U.S. provisional patent application No. 63/369,684, filed Jul. 28, 2022, which is hereby incorporated by reference herein in its entirety.

BACKGROUND

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels.

It is within this context that the embodiments described herein arise.

DETAILED DESCRIPTION

Embodiments of the present technology relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the pixels and readout circuitry for reading out image signals corresponding to the electric charge generated by the photosensitive elements.

Figure 1:
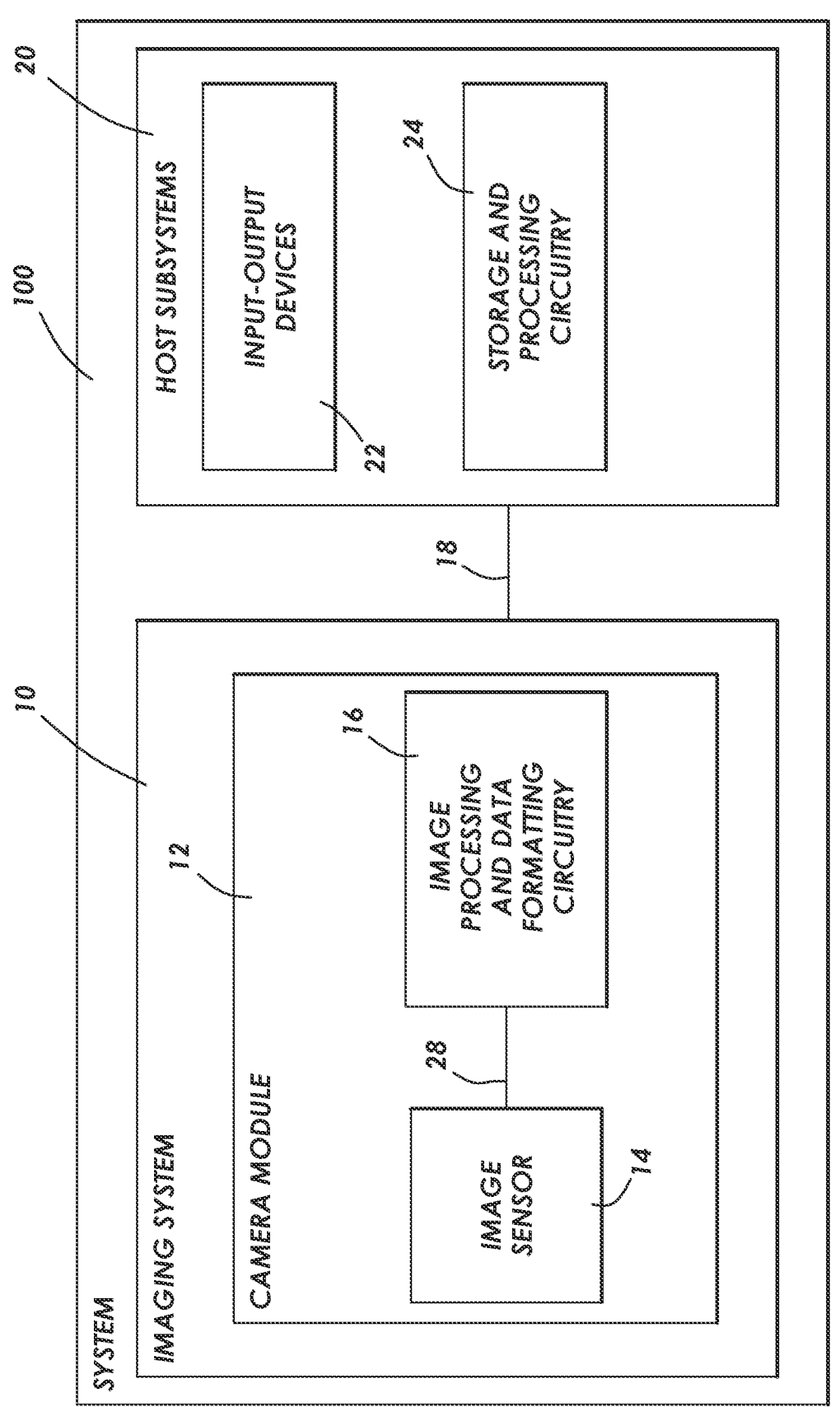
FIG. 1 is a diagram of an illustrative electronic device having an image sensor in accordance with some embodiments.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14, such as in an image sensor array integrated circuit, and one or more lenses.

During image capture operations, each lens may focus light onto an associated image sensor 14. Image sensor 14 may include photosensitive elements (i.e., image sensor pixels) that convert the light into analog data. Image sensors may have any number of pixels (e.g., hundreds, thousands, millions, or more). A typical image sensor may, for example, have millions of pixels (e.g., megapixels).

Each image sensor in camera module 12 may be identical or there may be different types of image sensors in a given image sensor array integrated circuit. In some examples, image sensor 14 may further include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), and/or address circuitry.

Still and video image data from sensor 14 may be provided to image processing and data formatting circuitry 16 via path 28. Image processing and data formatting circuitry 16 may be used to perform image processing functions such as data formatting, adjusting white balance and exposure, implementing video image stabilization, or face detection. Image processing and data formatting circuitry 16 may additionally or alternatively be used to compress raw camera image files if desired (e.g., to Joint Photographic Experts Group or JPEG format).

In one example arrangement, such as a system on chip (SoC) arrangement, sensor 14 and image processing and data formatting circuitry 16 are implemented on a common semiconductor substrate (e.g., a common silicon image sensor integrated circuit die). If desired, sensor 14 and image processing circuitry 16 may be formed on separate semiconductor substrates. For example, sensor 14 and image processing circuitry 16 may be formed on separate substrates that have been stacked.

Imaging system 10 may convey acquired image data to host subsystem 20 over path 18. Host subsystem 20 may include input-output devices 22 and storage processing circuitry 24. Host subsystem 20 may include processing software for detecting objects in images, detecting motion of objects between image frames, determining distances to objects in images, or filtering or otherwise processing images provided by imaging system 10. For example, image processing and data formatting circuitry 16 of the imaging system 10 may communicate the acquired image data to storage and processing circuitry 24 of the host subsystems 20.

If desired, system 100 may provide a user with numerous high-level functions. In a computer or cellular telephone, for example, a user may be provided with the ability to run user applications. For these functions, input-output devices 22 of host subsystem 20 may include keypads, input-output ports, buttons, and displays and storage and processing circuitry 24. Storage and processing circuitry 24 of host subsystem 20 may include volatile and/or nonvolatile memory (e.g., random-access memory, flash memory, hard drives, solid-state drives, etc.). Storage and processing circuitry 24 may additionally or alternatively include microprocessors, microcontrollers, digital signal processors, and/or application specific integrated circuits.

Figure 2:
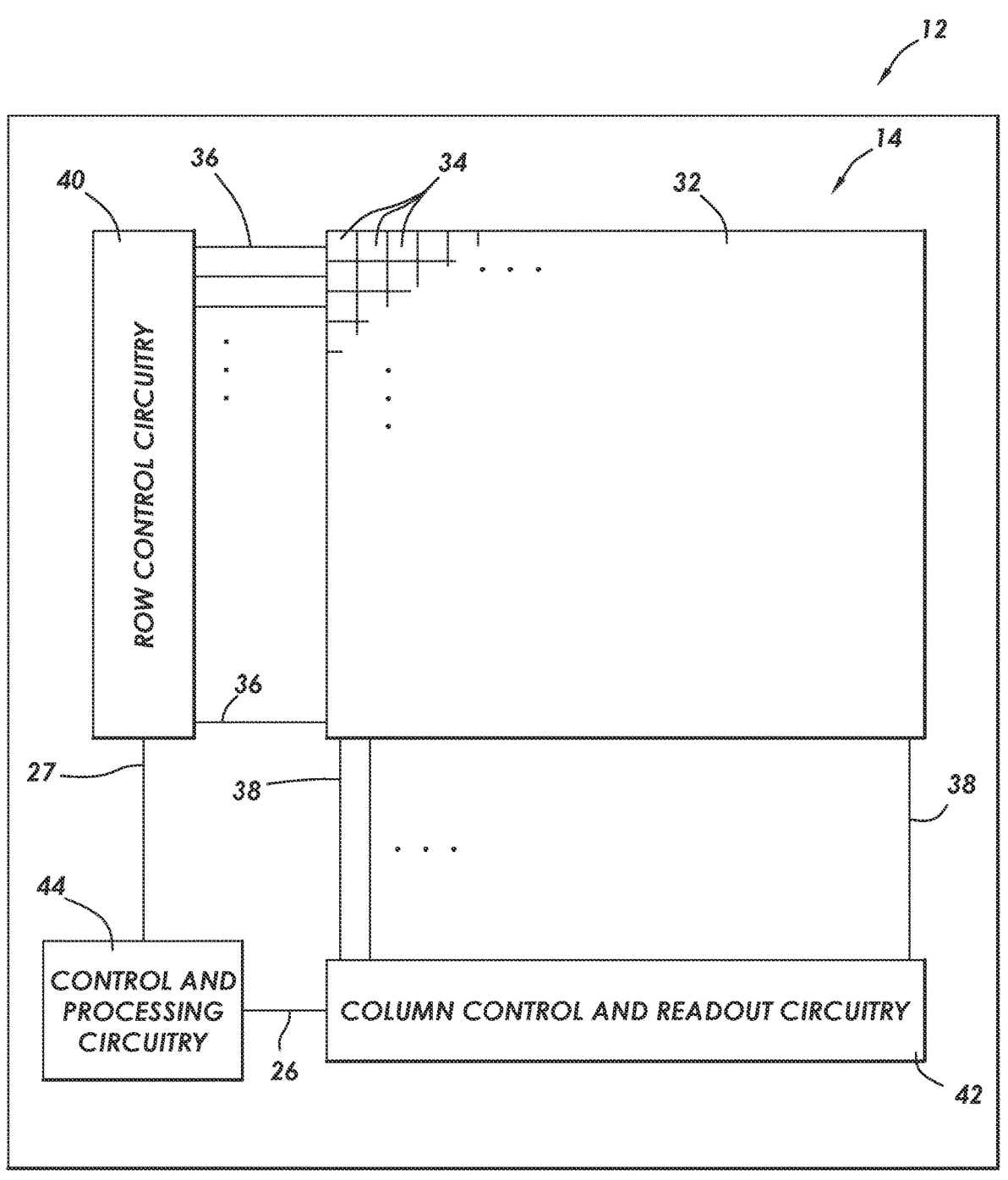
FIG. 2 is a diagram of an illustrative pixel array and associated row and column control circuitry for reading out image signals from an image sensor in accordance with some embodiments.

An example of an arrangement of image sensor 14 of FIG. 1 is shown in FIG. 2. As shown in FIG. 2, image sensor 14 may include control and processing circuitry 44. Control and processing circuitry 44 (sometimes referred to as control and processing logic) may be part of image processing and data formatting circuitry 16 in FIG. 1 or may be separate from circuitry 16. Image sensor 14 may include a pixel array such as array 32 of pixels 34 (sometimes referred to herein as image sensor pixels, imaging pixels, or image pixels). Control and processing circuitry 44 may be coupled to row control circuitry 40 via control path 27 and may be coupled to column control and readout circuits 42 via data path 26.

Row control circuitry 40 may receive row addresses from control and processing circuitry 44 and may supply corresponding row control signals to image pixels 34 over one or more control paths 36. The row control signals may include pixel reset control signals, charge transfer control signals, blooming control signals, row select control signals, dual conversion gain control signals, or any other desired pixel control signals.

Column control and readout circuitry 42 may be coupled to one or more of the columns of pixel array 32 via one or more conductive lines such as column lines 38. A given column line 38 may be coupled to a column of image pixels 34 in image pixel array 32 and may be used for reading out image signals from image pixels 34 and for supplying bias signals (e.g., bias currents or bias voltages) to image pixels 34. In some examples, each column of pixels may be coupled to a corresponding column line 38. For image pixel readout operations, a pixel row in image pixel array 32 may be selected using row driver circuitry 40 and image data associated with image pixels 34 of that pixel row may be read out by column readout circuitry 42 on column lines 38. Column readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, or column memory for storing the readout signals and any other desired data. Column control and readout circuitry 42 may output digital pixel readout values to control and processing logic 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure. Features described herein as rows may be arranged vertically and features described herein as columns may be arranged horizontally.

Pixel array 32 may be provided with a color filter array having multiple color filter elements which allows a single image sensor to sample light of different colors. As an example, image sensor pixels such as the image pixels in array 32 may be provided with a color filter array which allows a single image sensor to sample red, green, and blue (RGB) light using corresponding red, green, and blue image sensor pixels. The red, green, and blue image sensor pixels may be arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another example, broadband image pixels having broadband color filter elements (e.g., clear color filter elements) may be used instead of green pixels in a Bayer pattern. These examples are merely illustrative and, in general, color filter elements of any desired color (e.g., cyan, yellow, red, green, blue, etc.) and in any desired pattern may be formed over any desired number of image pixels 34.

In some implementations, array 32 may be part of a stacked-die arrangement in which pixels 34 of array 32 are split between two or more stacked substrates. In such an arrangement, each of the pixels 34 in the array 32 may be split between the two dies (sometimes referred to as chips) at any desired node within the pixel. As an example, a node such as the floating diffusion node may be formed across two dies. Pixel circuitry that includes the photodiode and the circuitry between the photodiode and the desired node (such as the floating diffusion node, in the present example) may be formed on a first die, and the remaining pixel circuitry may be formed on a second die. The desired node may be formed on (i.e., as a part of) a coupling structure (such as a conductive pad, a micro-pad, a conductive interconnect structure, or a conductive via) that connects the two dies. Before the two dies are bonded, the coupling structure may have a first portion on the first die and may have a second portion on the second die. The first die and the second die may be bonded to each other such that first portion of the coupling structure and the second portion of the coupling structure are bonded together and are electrically coupled. If desired, the first and second portions of the coupling structure may be compression bonded to each other. However, this is merely illustrative. If desired, the first and second portions of the coupling structures formed on the respective first and second dies may be bonded together using any metal-to-metal bonding technique, such as soldering or welding.

As mentioned above, the desired node in the pixel circuit that is split across the two dies may be a floating diffusion node. Alternatively, the desired node in the pixel circuit that is split across the two dies may be any other node along the pixel circuit. In one alternative, the desired node split across two dies may be the node between a floating diffusion region and the gate of a source follower transistor. For example, the floating diffusion node may be formed on the first die on which the photodiode is formed, while the coupling structure may connect the floating diffusion node to the source follower transistor on the second die. In another alternative, the desired node split across two dies may be the node between a floating diffusion region and a source-drain node of a transfer transistor. For example, the floating diffusion node may be formed on the second die on which the photodiode is not located. In yet another alternative, the desired node split across two dies may be the node between a source-drain node of a source follower transistor and a row select transistor.

In general, array 32, row control circuitry 40, and column control and readout circuitry 42 may be split between two or more stacked substrates. In one example, array 32 may be formed in a first substrate and row control circuitry 40 and column control and readout circuitry 42 may be formed in a second substrate. In another example, array 32 may be split between first and second substrates (using one of the pixel splitting schemes described above) and row control circuitry 40 and column control and readout circuitry 42 may be formed in a third substrate. In other examples, row control circuitry 40 may be on a separate substrate from column control and readout circuitry 42. In yet another example, row control circuitry 40 may be split between two or more substrates and/or column control and readout circuitry 42 may be split between two or more substrates.

FIGS. 3-12 show, at various stages, a method of forming an image sensor such as the image sensor in FIGS. 1-2. Each one of FIGS. 3-12 is a cross-sectional side view of the image sensor during the manufacturing process for the image sensor. One or more manufacturing steps is performed to change the image sensor from the appearance in FIG. 3 to the appearance in FIG. 4, from the appearance in FIG. 4 to the appearance in FIG. 5, from the appearance in FIG. 5 to the appearance in FIG. 6, etc.

Figure 3:
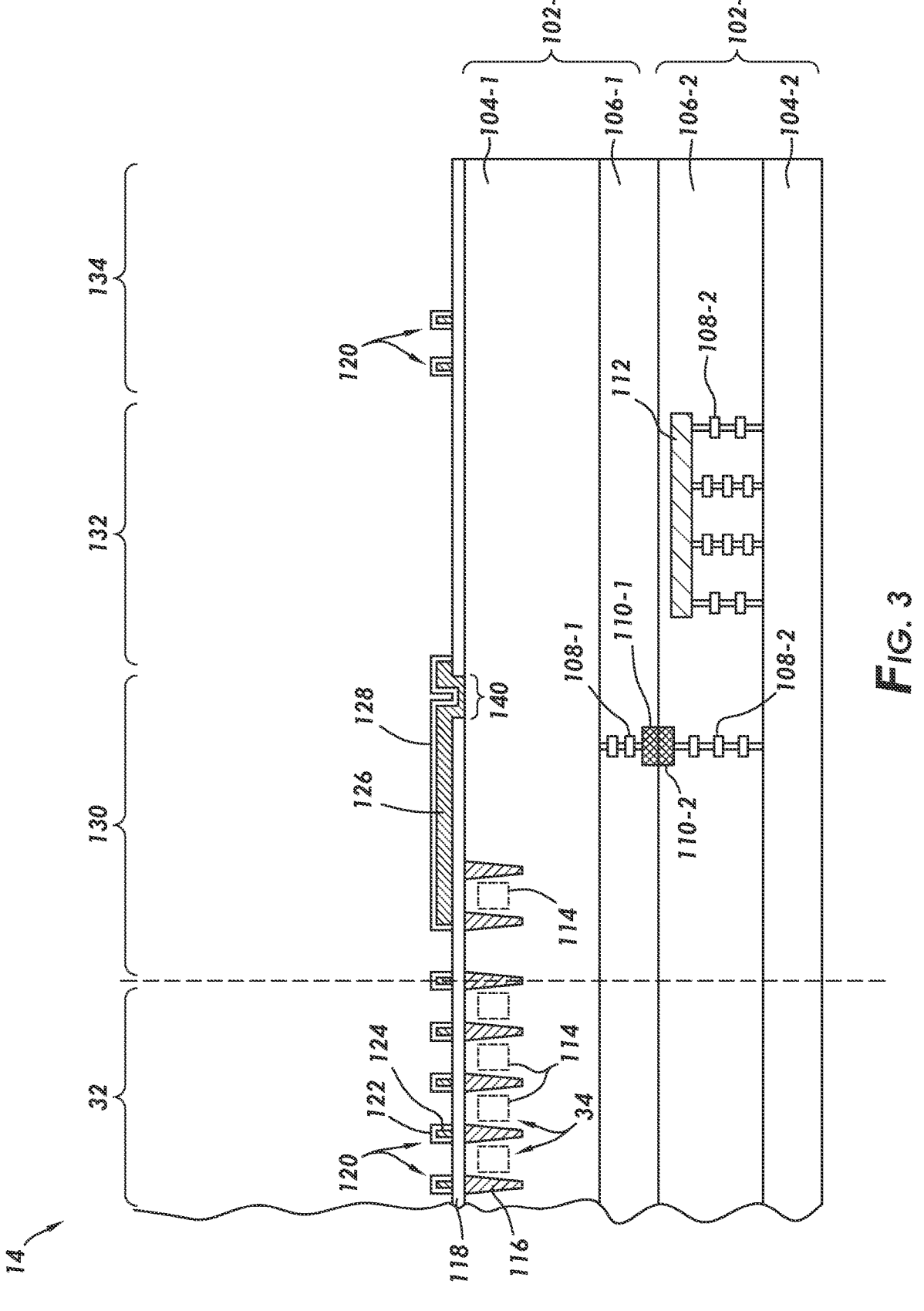
FIG. 3 is a cross-sectional side view of an illustrative image sensor with a conductive light shield in accordance with some embodiments.

As shown in FIG. 3, image sensor 14 includes first and second chips 102-1 and 102-2. Each chip may sometimes be referred to as a wafer or die. Chip 102-1 may sometimes be referred to as a sensor chip whereas chip 102-2 may sometimes be referred to as an application-specific integrated circuit (ASIC) chip.

The first chip 102-1 includes a semiconductor substrate 104-1 and one or more dielectric layers 106-1. The semiconductor substrate 104-1 (sometimes referred to as semiconductor layer 104-1, silicon layer 104-1, sensor substrate 104-1, etc.) may include photosensitive elements 114 for pixels 34 in array 32. The one or more dielectric layers 106-1 may include various metal layers 108-1 for forming electrical connections within chip 102-1.

The second chip 102-2 includes a semiconductor substrate 104-2 and one or more dielectric layers 106-2. The semiconductor substrate 104-2 (sometimes referred to as semiconductor layer 104-2, silicon layer 104-2, ASIC substrate 104-2, etc.) may include circuitry such as row control circuitry 40, control and processing circuitry 44, and/or column control and readout circuitry. The one or more dielectric layers 106-2 may include various metal layers 108-2 for forming electrical connections within chip 102-2.

As shown in FIG. 3, there may be one or more bonds (sometimes referred to as hybrid bonds) between chips 102-1 and 102-2. In FIG. 3, the hybrid bond between chips 102-1 and 102-2 is formed by conductive layer 110-1 in chip 102-1 and conductive layer 110-2 in chip 102-2. There may be any desired number of hybrid bonds connecting the sensor chip 102-1 to the ASIC chip 102-2.

The image sensor has a pixel array 32 with pixels 34 distributed across an active area. The pixels in pixel array 32 are configured to sense incident light during operation of image sensor 14. Each pixel 34 may include a respective photosensitive element 114 (such as a photodiode). Each photosensitive element may be surrounded by a ring of deep trench isolation (DTI) 116. The DTI may be formed by a filler material (e.g., a metal filler or low-index filler) in a trench in semiconductor substrate 104-1. The filler material may be partially inside the DTI or extend along the entire depth of the DTI. Although the DTI is shown as partially in substrate 104-1 it may extend through the entire depth of substrate 104-1. The DTI in FIG. 3 is shown as being formed from the backside of the image sensor, but it may instead be formed from the front side of the image sensor. One or more dielectric layers 118 may be formed over semiconductor substrate 104-1. The one or more dielectric layers 118 may include, for example, a layer of aluminum oxide ($Al_2O_3$) on top of substrate 104-1, a layer of hafnium oxide ($HfO_2$) on top of the layer of aluminum oxide, a layer of tantalum oxide ($Ta_2O_5$) on top of the layer of hafnium oxide, and a layer of silicon dioxide ($SiO_2$) on top of the layer of tantalum oxide. As shown in FIG. 3, the one or more dielectric layers 118 may be formed as blanket layers across the entire image sensor. In addition to being formed on an upper surface of semiconductor substrate 104-1 as depicted in FIG. 3, the one or more dielectric layers 118 may be formed within the DTI 116.

Image sensor 14 may include grid structures 120 (sometimes referred to as opaque structures 120, in-pixel grid structures 120, etc.) on top of dielectric layer(s) 118. The in-pixel grid structures may include one or more conductive layers 124 that form a ring around the footprint of each pixel 34. The conductive layers 124 may include, for example, a layer of conductive material (e.g., tungsten) and an adhesion layer (e.g., a titanium nitride layer). The layer of conductive material may be formed over the adhesion layer. One or more of the conductive layers (e.g., the tungsten layer) may be opaque to incident light. The grid structures 120 may have a transparency to visible light, infrared light, and/or other wavelengths of interest of less than 20%, less than 10%, less than 5%, less than 1%, less than 0.01%, less than 0.001%, etc. The grid structures 120 may have an optical density of 5 (OD5) or greater. The in-pixel grid structures 120 therefore mitigate cross-talk in image sensor 14 as well as dissipate any undesirable electrical charge. The in-pixel grid structures 120 may also include a dielectric layer 122 that surrounds the conductive layers 124. The dielectric layer 122 may be formed from silicon dioxide or any other desired material.

As shown in FIG. 3, the image sensor also includes a peripheral region 130, bond pad region 132, and scribe region 134. Peripheral region 130 includes a light shielding layer 126, such as a conductive light shield. The light shielding layer 126 may be substantially opaque to incident light. The light shielding layer may have a transparency to visible light, infrared light, and/or other wavelengths of interest of less than 20%, less than 10%, less than 5%, less than 1%, less than 0.01%, less than 0.001%, etc. The light shielding layer may have an optical density of 5 (OD5) or greater. The light shielding layer 126 may be formed from the same material(s) as the one or more conductive layers 124 for the in-pixel grid structures 120. In other words, light shielding layer 126 also may be formed from a layer of tungsten over a layer of titanium nitride. Similar to how in-pixel grid structures 120 include a dielectric layer 122 over conductive layer(s) 124, there may be a dielectric layer 128 over light shielding layer 126. Dielectric layer 128 may be formed from the same material as dielectric layer 122 (e.g., silicon dioxide). Conductive layer(s) 124 and light shielding layer(s) 126 may be formed in the same manufacturing step(s). Dielectric layers 122 and 128 may be formed in the same manufacturing step.

Light shielding layer 126 may overlap one or more photosensitive elements 114 in peripheral region 130. The shielded photosensitive element(s) under the light shielding layer are used to provide optically black pixels (which may be used for noise correction during operation of image sensor 14).

As shown in FIG. 3, there may be an opening etched in dielectric layer(s) 118 to allow a portion of light shielding layer 126 to be electrically connected to substrate 104-1, thereby forming a ground contact 140. Specifically, light shielding layer 126 may be electrically connected to a deep implant region of substrate 104-1 at ground contact 140. The in-pixel grid structures 120 may be electrically connected to the light shielding layer 126 such that both structures 120 and light shielding layer 126 are electrically grounded through the silicon substrate at ground contact 140.

In bond pad region 132, ASIC chip 102-2 includes a bond pad 112 in dielectric layers 106-2. In scribe region 134, additional structures 120 may be formed (e.g., to help with formation of subsequent alignment marks).

Figure 4:
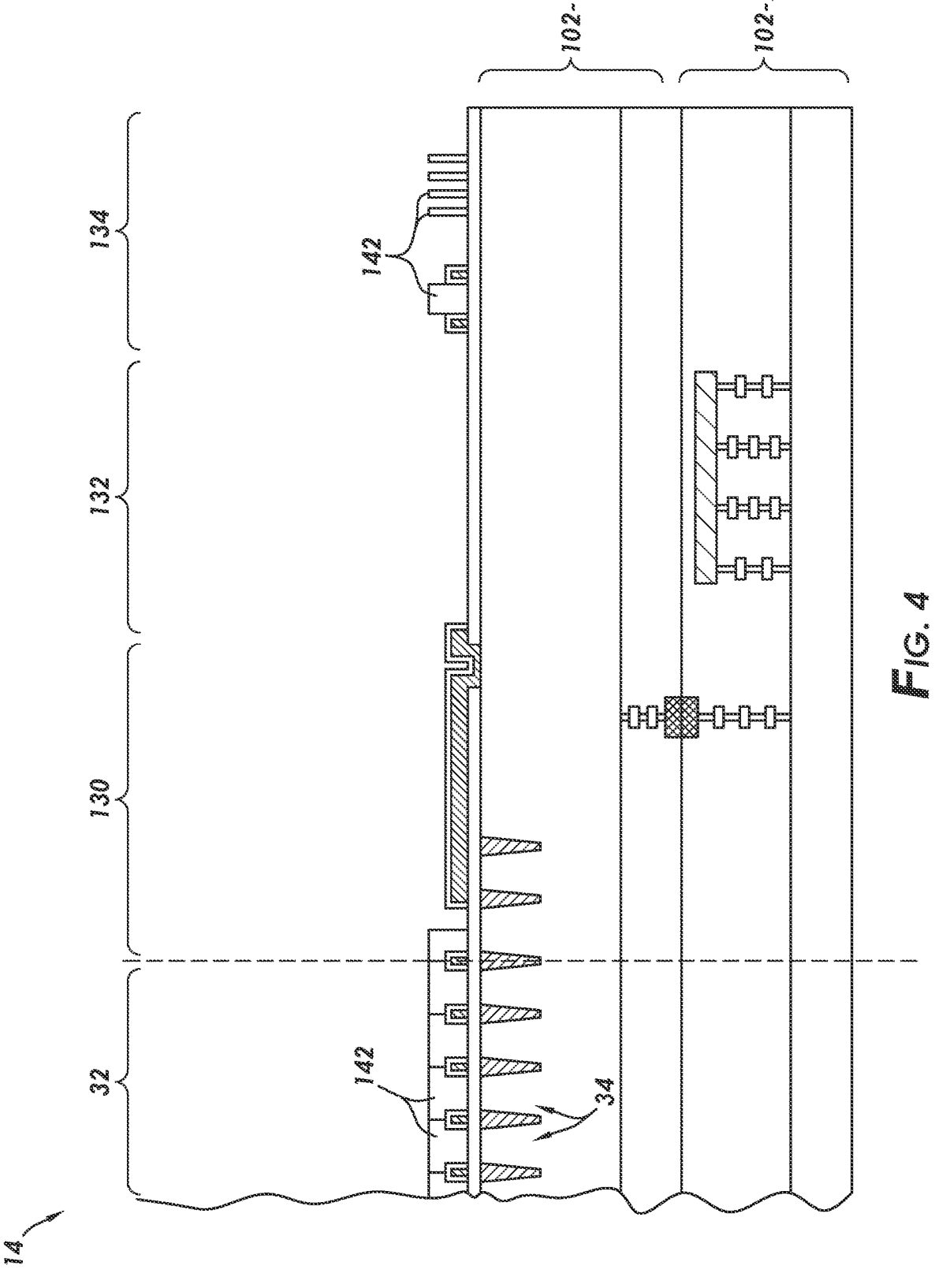
FIG. 4 is a cross-sectional side view of the illustrative image sensor of FIG. 3 after color filter elements are added to the image sensor in accordance with some embodiments.

In FIG. 4, color filter elements 142 have been formed over each pixel in pixel array 32. Each color filter element 142 may pass light of any desired color (e.g., red, blue, green, yellow, cyan, etc.). In some cases, the image sensor may be a monochrome image sensor and each color filter element may be a clear or gray color filter element. As shown in FIG. 4, a color filter element 142 may be formed in scribe region 134. This color filter element may serve as an alignment mark for subsequent manufacturing steps. Alternatively, a dedicated alignment mark deposition step may be performed (separate from the color filter element deposition).

Figure 5:
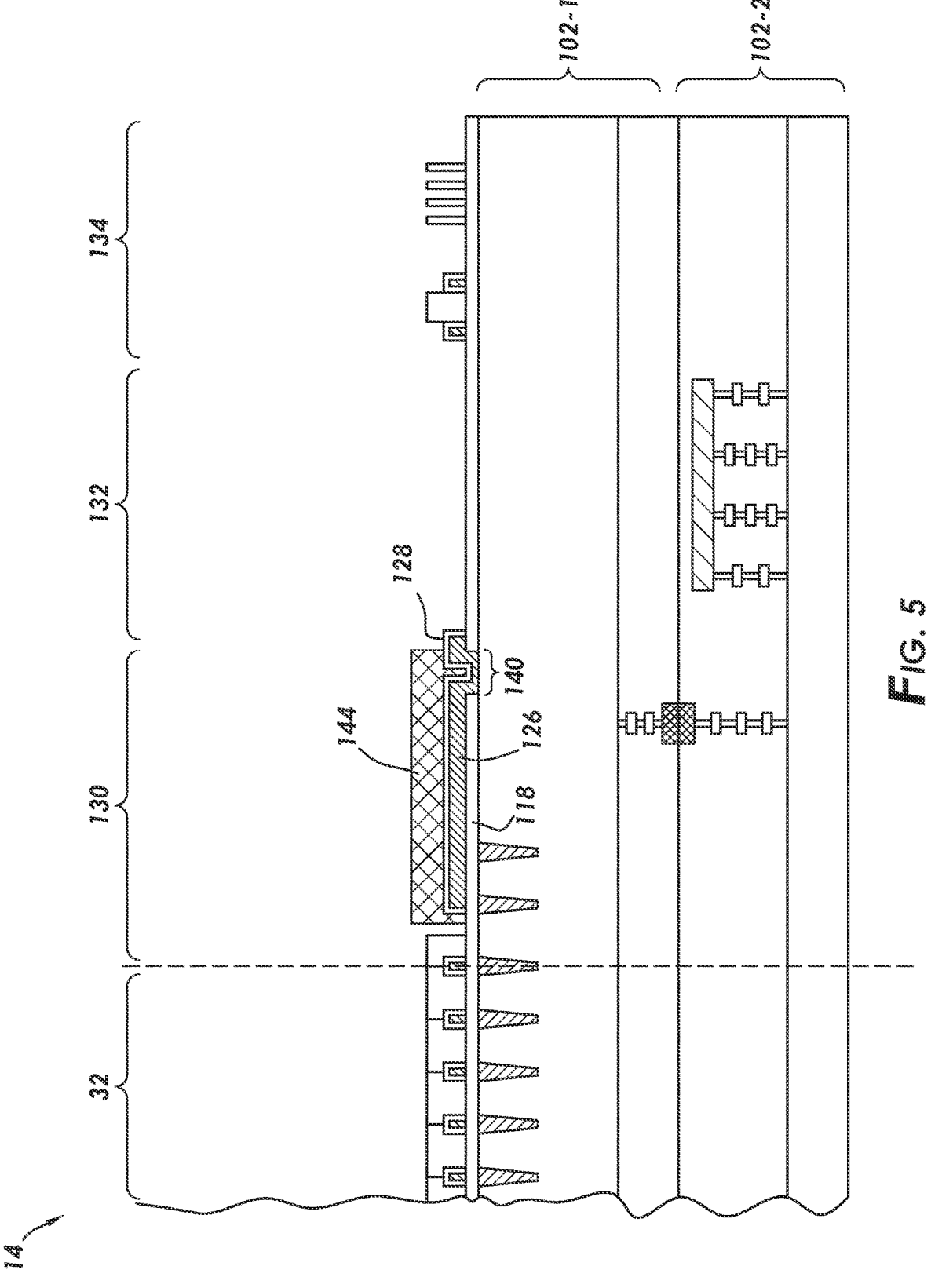
FIG. 5 is a cross-sectional side view of the illustrative image sensor of FIG. 4 after an opaque layer is added to the image sensor in accordance with some embodiments.

Next, in FIG. 5, an opaque layer 144 (sometimes referred to as opaque dielectric layer 144, black layer 144, black dielectric layer 144, etc.) may be formed over light shielding layer 126 in peripheral region 130. The opaque layer 144 may conform to the light shielding layer 126 (with associated dielectric layer 128). The opaque layer 144 directly contacts an upper surface of dielectric layer(s) 118 and dielectric layer 128. The opaque layer 144 may have a reflectance of visible light, infrared light, and/or other wavelengths of interest of less than 20%, less than 10%, less than 5%, less than 1%, etc. The opaque layer may have an optical density of 2 (OD2) or greater. The opaque layer 144 therefore prevents visible reflections off the underlying light shielding layer.

The example of forming the black dielectric layer in the image sensor after forming all of the color filter elements in the image sensor is merely illustrative. If desired, the black dielectric layer may be formed before one or more types of color filter elements included in the image sensor. As one example, a first type of color filter element (e.g., all of the green color filter elements) may be formed in the image sensor. The black dielectric layer may then be formed in the image sensor. Finally, the remaining type(s) of color filter elements (e.g., all of the red and blue color filter elements) may be formed in the image sensor.

Figure 6:
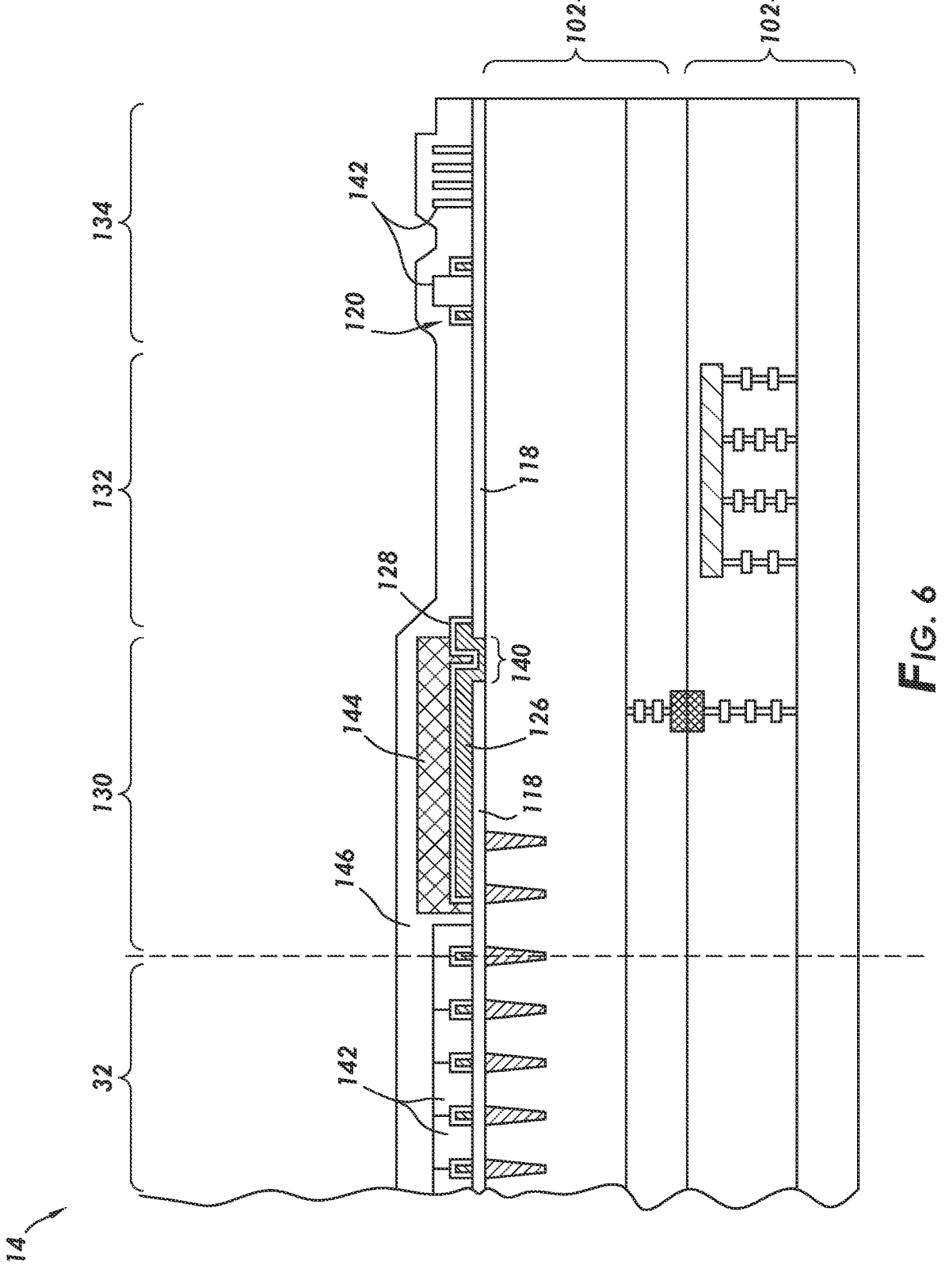
FIG. 6 is a cross-sectional side view of the illustrative image sensor of FIG. 5 after a planarization layer is added to the image sensor in accordance with some embodiments.

In FIG. 6, a planarization layer 146 is formed over the image sensor. The planarization layer 146 may be formed from any desired dielectric material. The planarization layer 146 may cover (and directly contact) color filter elements 142 in pixel array 32. The planarization layer 146 may cover (and directly contact) opaque layer 144, dielectric layer(s) 118, and/or dielectric layer 128 in peripheral region 130. The planarization layer 146 may cover (and directly contact) dielectric layer(s) 118 in bond pad region 132. The planarization layer 146 may cover (and directly contact) structures 120, dielectric layer(s) 118, and/or color filter elements 142 in scribe region 134. In addition to providing a planar surface for the microlenses, planarization layer 146 may advantageously absorb energy during the microlens formation process.

Figure 7:
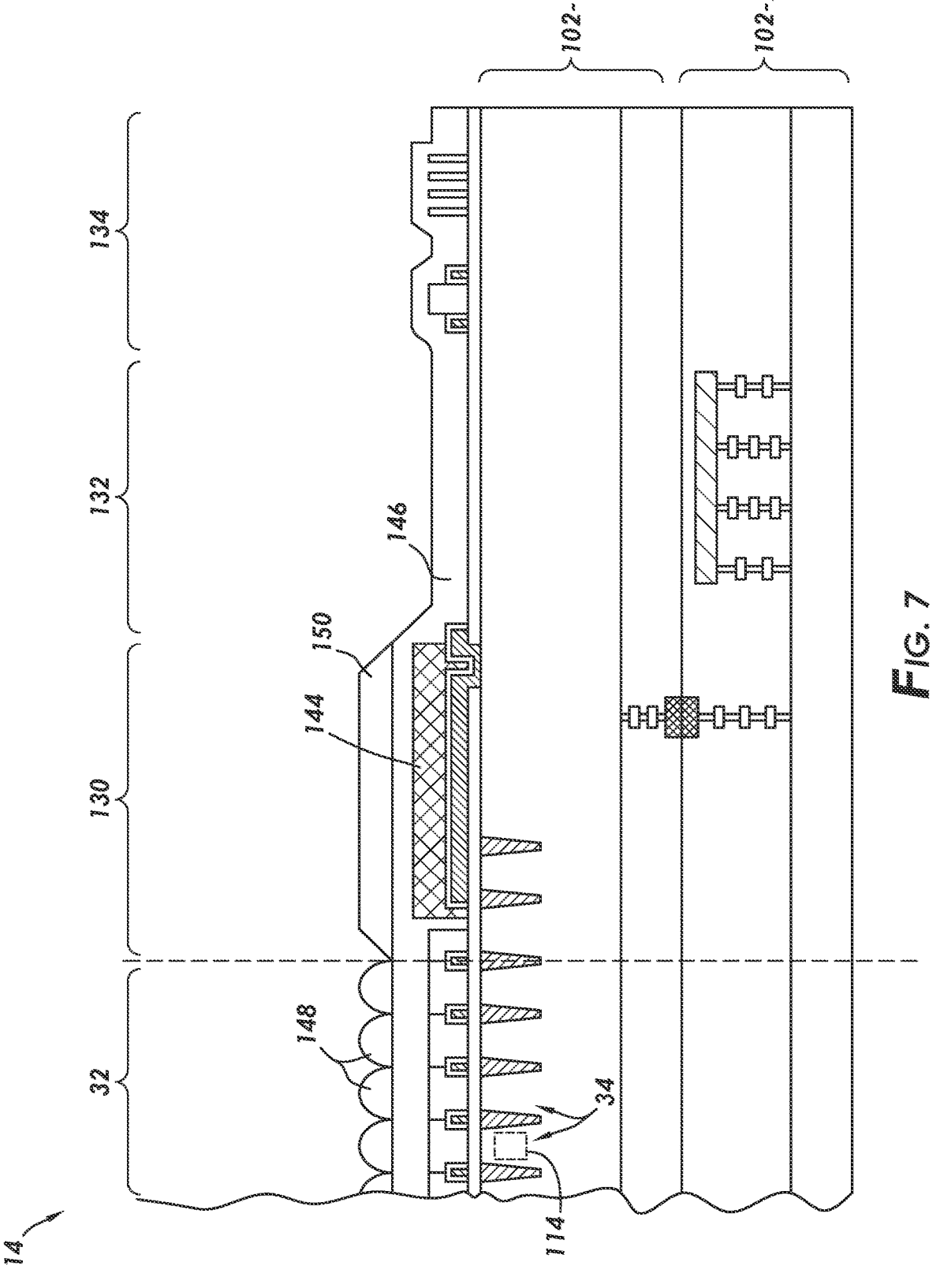
FIG. 7 is a cross-sectional side view of the illustrative image sensor of FIG. 6 after microlenses are added to the image sensor in accordance with some embodiments.

Next, in FIG. 7, microlenses 148 may be formed over each pixel 34 in pixel array 32. Each microlens 148 may overlap a corresponding color filter element 142 and photosensitive element 114. The microlenses 148 are formed on the planar upper surface provided by planarization layer 146.

The microlenses 148 may be formed in a two-step process if desired. In the two-step process, a first half of the microlenses are fully formed in a checkerboard pattern in a first step. The remaining half of the microlenses are then fully formed in a complementary checkerboard pattern. This allows the microlenses to be in direct contact without causing the microlenses to merge together during the manufacturing process. This example is merely illustrative. The microlenses 148 may instead be formed in a single-step process if desired.

As shown in FIG. 7, a planar layer 150 may be formed in peripheral region 130. The planar layer 150 may be formed from the same material as microlenses 148 or from a different material than microlenses 148. In one illustrative arrangement, microlenses 148 are formed in peripheral region 130. The planar layer 150 is then formed over the microlenses 148 to effectively cover the microlenses and provide a planar upper surface in peripheral region 130.

This example is merely illustrative. If desired, microlenses 148 may be formed in peripheral region 130 and planar layer 150 may be omitted.

Figure 8:
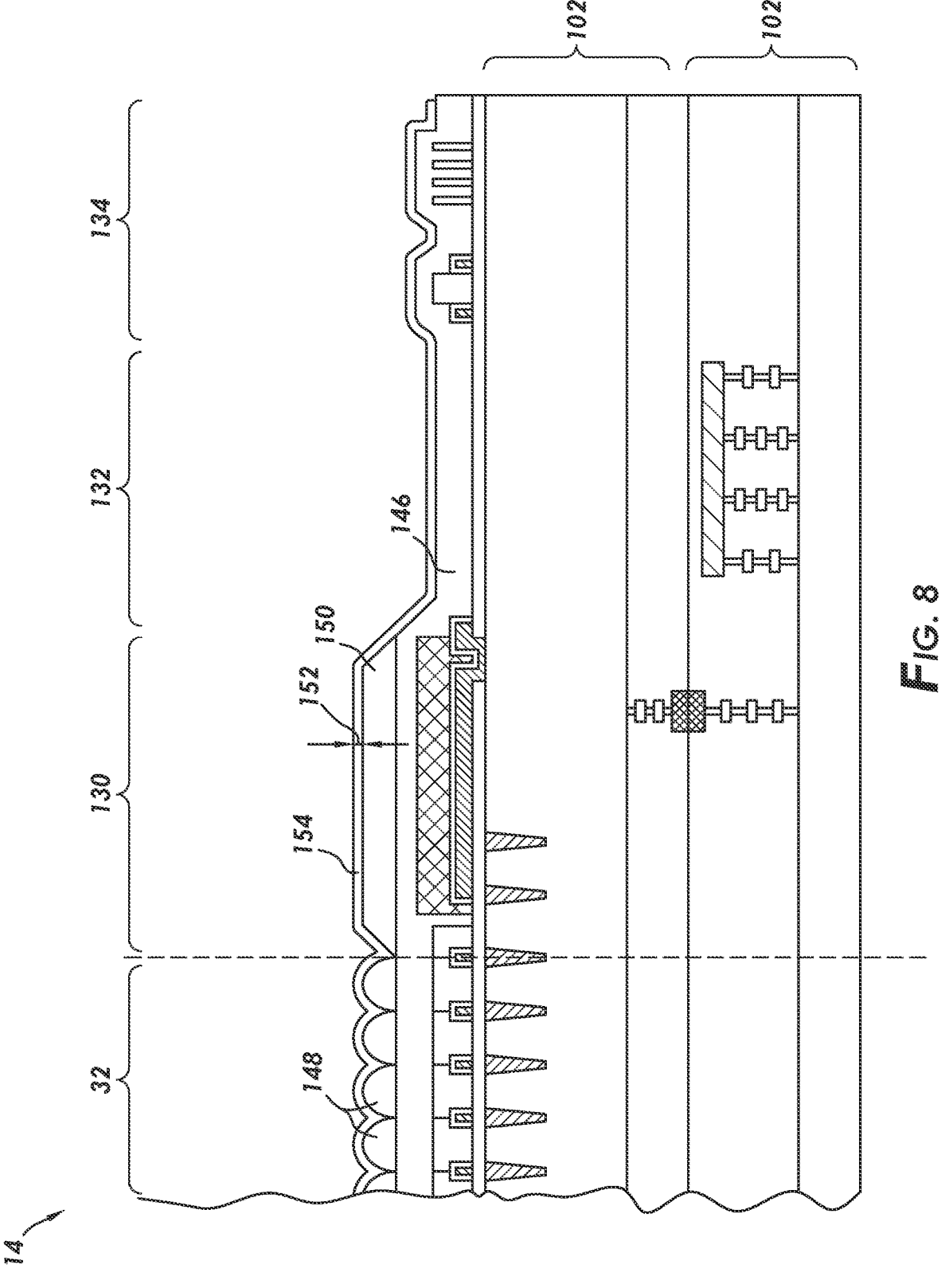
FIG. 8 is a cross-sectional side view of the illustrative image sensor of FIG. 7 after an anti-reflective layer is added to the image sensor in accordance with some embodiments.

In FIG. 8, an anti-reflective coating (ARC) 154 (sometimes referred to as anti-reflective layer 154, silicon dioxide layer 154, dielectric layer 154, etc.) is formed as a blanket layer across the entire image sensor. The anti-reflective coating 154 may be formed from silicon dioxide or any other desired material. The anti-reflective coating may have a uniform thickness 152 across the image sensor. In other words, the thickness 152 may be uniform within 10%, within 20%, within 30%, etc. across the image sensor. Thickness 152 may be less than 500 nanometers, less than 300 nanometers, less than 200 nanometers, greater than 50 nanometers, between 50 nanometers and 500 nanometers, between 50 nanometers and 150 nanometers, 100 nanometers, etc.

The anti-reflective coating 154 may cover (and directly contact) microlenses 148 in pixel array 32. The anti-reflective coating 154 may cover (and directly contact) planar layer 150 in peripheral region 130. The anti-reflective coating 154 may cover (and directly contact) planarization layer 146 in bond pad region 132. The anti-reflective coating 154 may cover (and directly contact) planarization layer 146 in scribe region 134.

Figure 9:
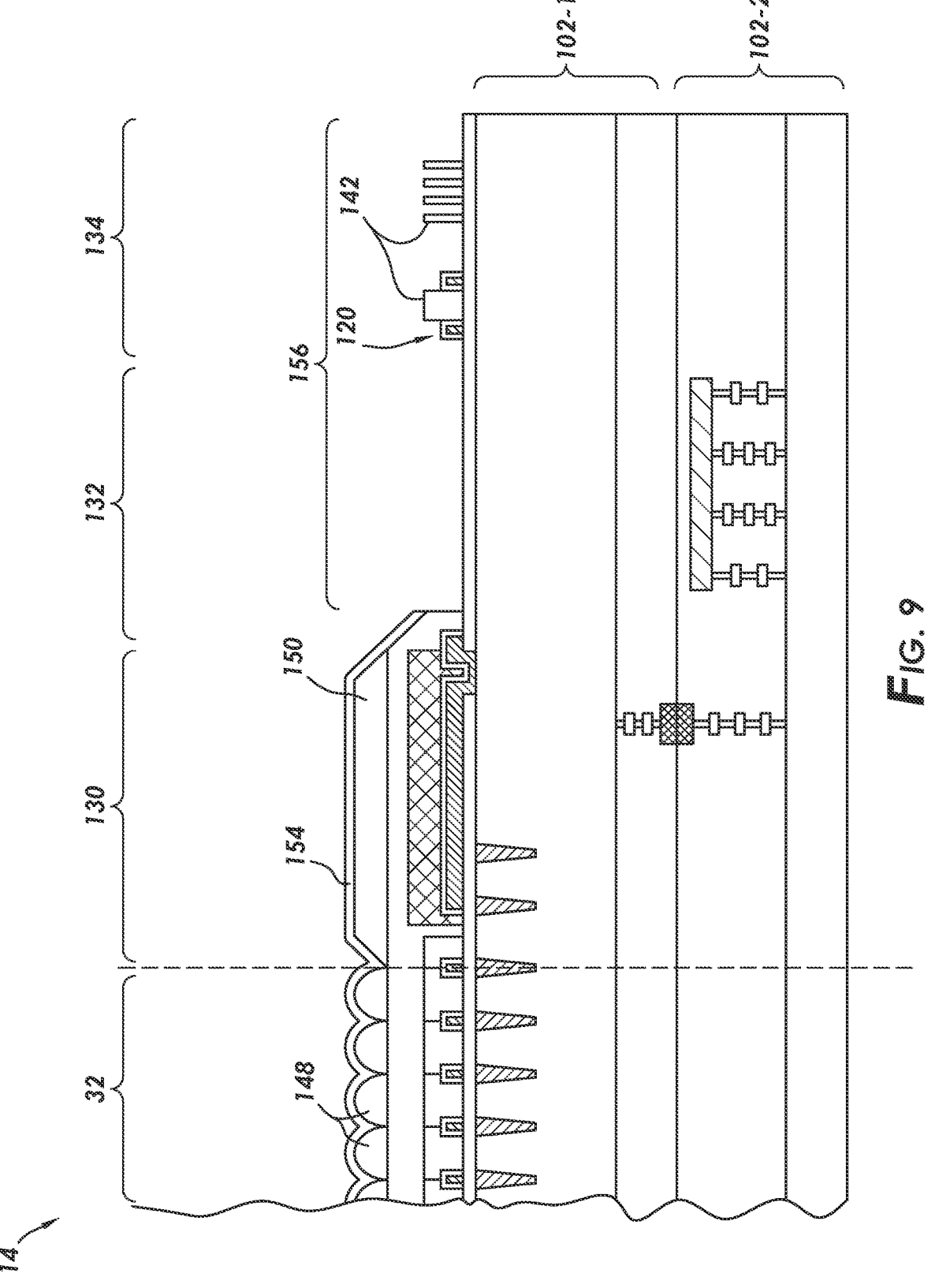
FIG. 9 is a cross-sectional side view of the illustrative image sensor of FIG. 8 after a planarization layer and anti-reflective layer are etched in accordance with some embodiments.

In FIG. 9, anti-reflective coating 154 and planarization layer 146 are etched (removed) in region 156 to expose the underlying dielectric layer(s) 118, structures 120, and color filter elements 142. Region 156 may include the bond pad region 132 and the scribe region 134.

Figure 10:
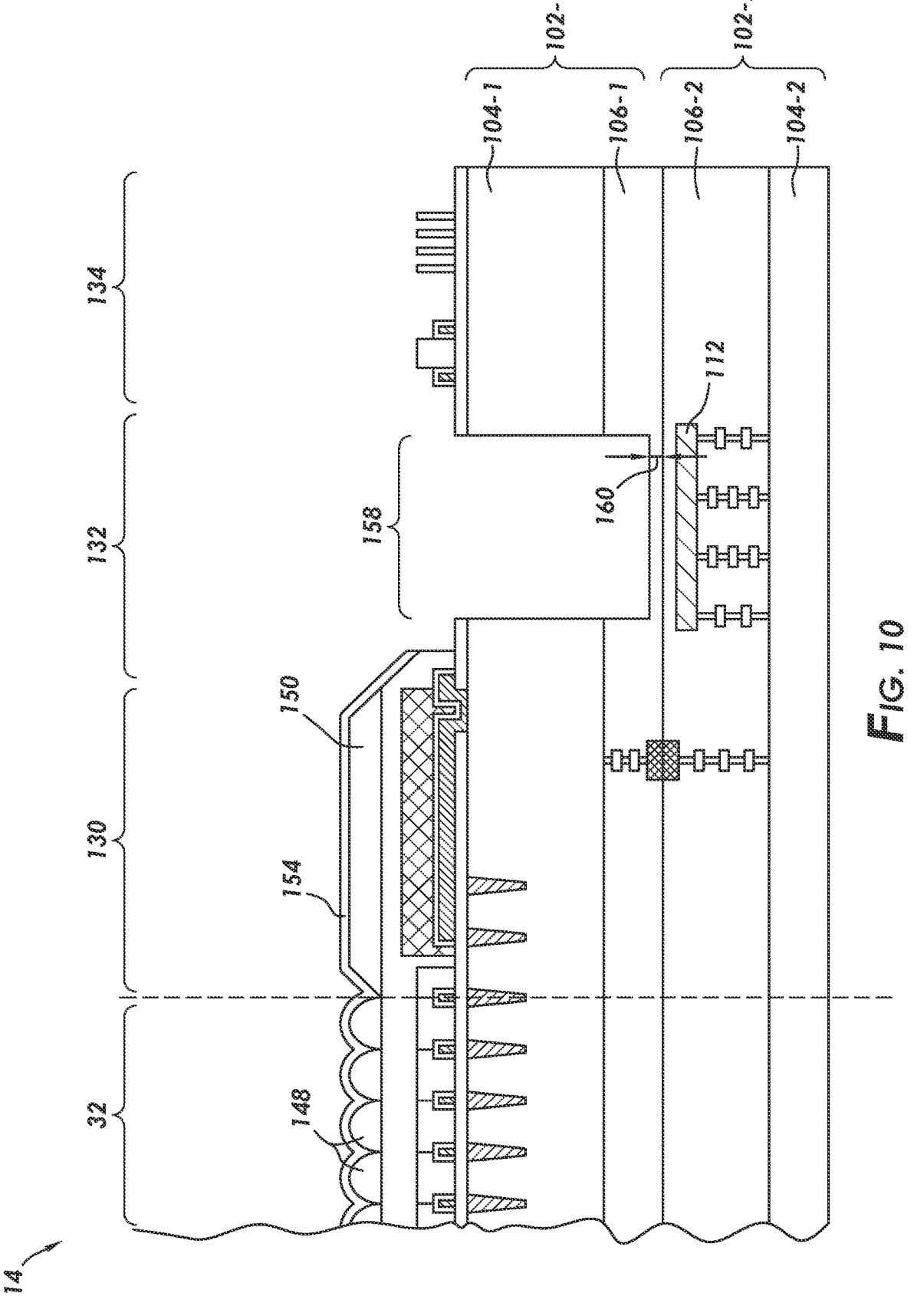
FIG. 10 is a cross-sectional side view of the illustrative image sensor of FIG. 9 after a trench is formed partially through a first chip in accordance with some embodiments.

Next, in FIG. 10, dielectric layer(s) 118, semiconductor substrate 104-1, and a portion of dielectric layer(s) 106-1 are etched (removed) in region 158. After the etching is complete, there is a trench extending entirely through semiconductor substrate 104-1 and partially through dielectric layer(s) 106-1. As shown in FIG. 10, the etching may leave a portion of dielectric layer(s) 106-1 with a remaining thickness 160. By not etching completely to bond pad 112 at this stage, the bond pad 112 remains protected during subsequent processing. Thickness 160 may be greater than 10 nanometers, greater than 50 nanometers, greater than 100 nanometers, greater than 500 nanometers, etc.

Figure 11:
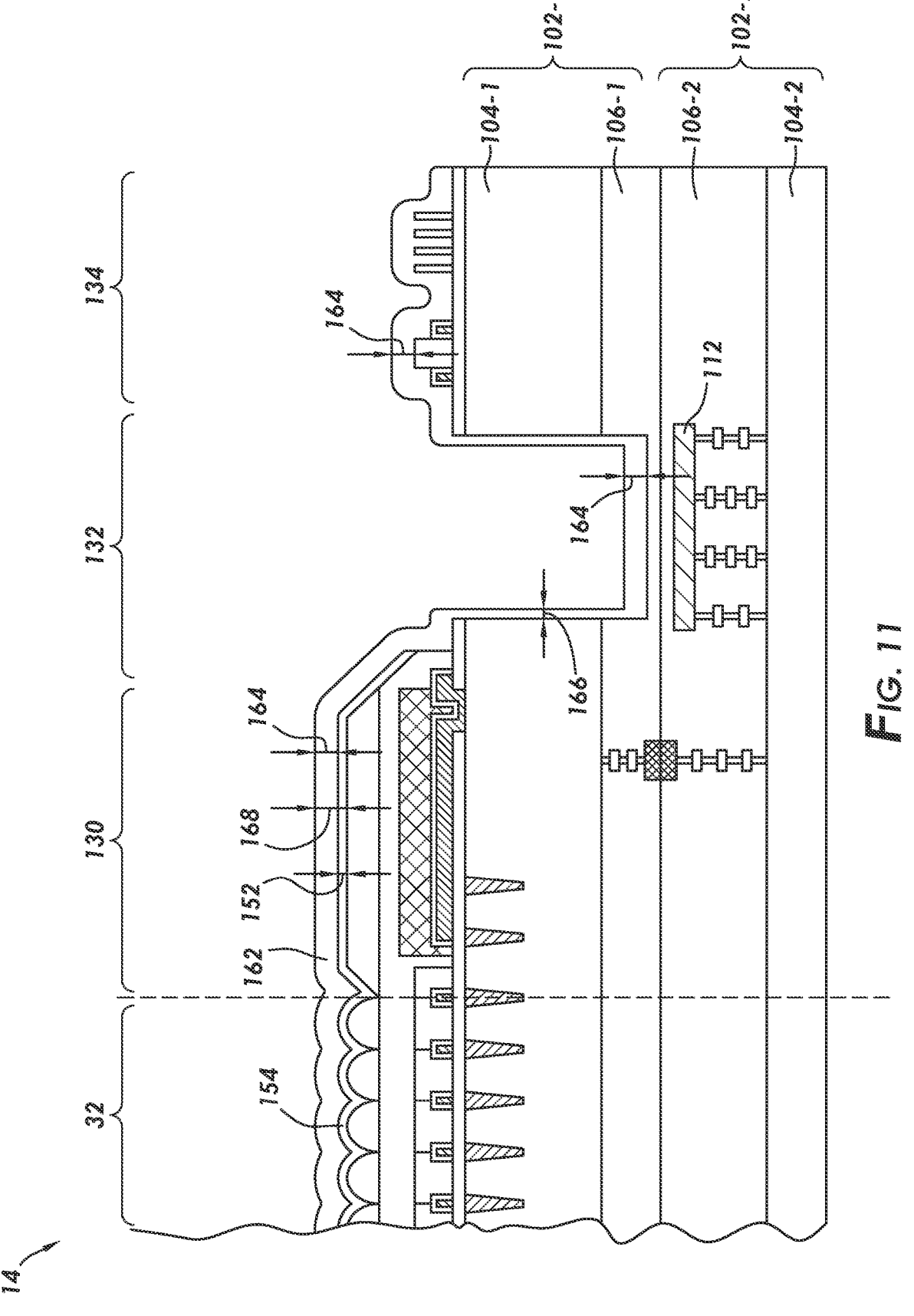
FIG. 11 is a cross-sectional side view of the illustrative image sensor of FIG. 10 after an additional anti-reflective layer is added to the image sensor in accordance with some embodiments.

In FIG. 11, an additional anti-reflective coating 162 (sometimes referred to as anti-reflective layer 162, silicon dioxide layer 162, dielectric layer 162, etc.) is formed as a blanket layer across the entire image sensor. The anti-reflective coating 162 may be formed from silicon dioxide or any other desired material. The anti-reflective coating may have a uniform thickness 164 across pixel array 32 and peripheral region 130. In other words, the thickness 164 may be uniform within 10%, within 20%, within 30%, etc. across pixel array 32 and peripheral region 130. Thickness 164 may be less than 500 nanometers, less than 300 nanometers, less than 200 nanometers, greater than 50 nanometers, between 50 nanometers and 500 nanometers, between 150 nanometers and 250 nanometers, 200 nanometers, etc.

Within bond pad region 132, the anti-reflective coating 162 has a thickness 166 along the sidewalls (e.g., along the edge of substrate 104-1 and dielectric layers 106-1 that are orthogonal to the upper surface of bond pad 112) and thickness 164 along the exposed upper surface of dielectric layers 106-1 (parallel to the upper surface of bond pad 112). Thickness 166 may be less than thickness 164. Thickness 166 may be less than 500 nanometers, less than 300 nanometers, less than 200 nanometers, less than 100 nanometers, less than 50 nanometers, between 50 nanometers and 100 nanometers, etc. Thickness 166 may be less than 75% of thickness 164, less than 50% of thickness 164, between 25% and 75% of thickness 164, etc.

Anti-reflective layer 162 and anti-reflective layer 154 may be formed from the same material (e.g., silicon dioxide). Accordingly, within pixel array 32 and peripheral region 130 there is effectively an anti-reflective coating with a thickness 168, where thickness 168 is equal to the sum of thickness 164 and thickness 152. Thickness 152 may be less than 75% of thickness 164, less than 50% of thickness 164, between 25% and 75% of thickness 164, etc. The total thickness 168 may be less than 1000 nanometers, less than 500 nanometers, less than 300 nanometers, greater than 50 nanometers, greater than 200 nanometers, between 100 nanometers and 1000 nanometers, between 250 nanometers and 350 nanometers, 300 nanometers, etc.

If desired, total thickness 168 may be approximately equal (e.g., within 20% of) to three quarters of a wavelength of interest (e.g., a wavelength sensed by the image sensor).

Figure 12:
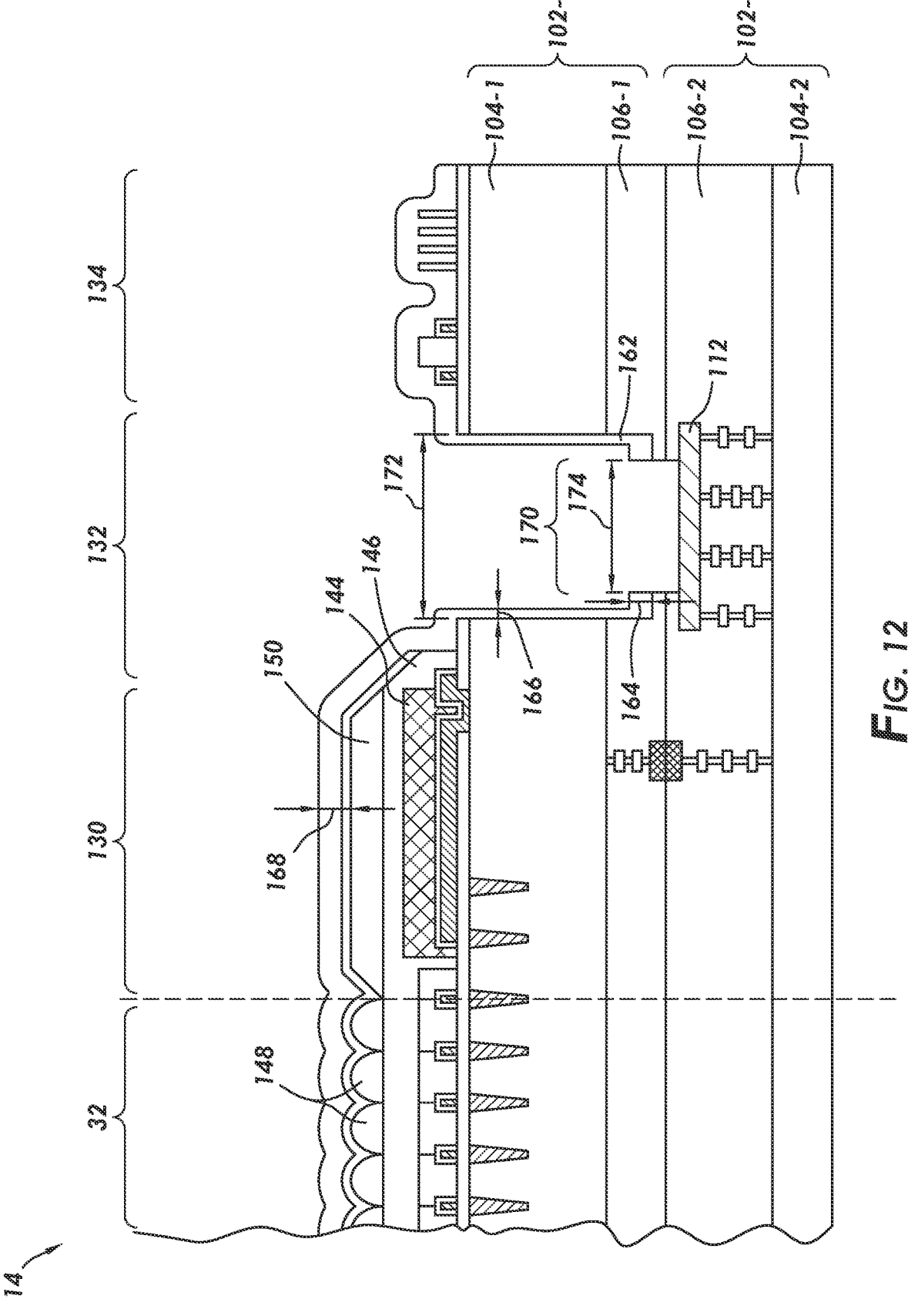
FIG. 12 is a cross-sectional side view of the illustrative image sensor of FIG. 11 after the trench is extended to expose a bond pad in accordance with some embodiments.

Finally, in FIG. 12, anti-reflective coating 162, dielectric layer(s) 106-1, and dielectric layer(s) 106-2 are etched (removed) in region 170 to expose the underlying bond pad 112. This etching step may be referred to as adding a second trench or may be referred to as extending the first trench. A portion of anti-reflective coating 162 remains with thickness 164 at the bottom of the previous trench from FIGS. 10 and 11.

After the etching is complete, bond pad 112 is exposed through a trench that has a first width 172 in a first portion and a second width 174 in a second portion. The second width 174 is less than the first width 172 (e.g., by at least 1%, by at least 5%, by at least 10%, by at least 20%, etc.). The trench extends entirely through semiconductor substrate 104-1 and dielectric layer(s) 106-1.

In image sensor 14 in FIGS. 3-12, the opaque layer 144 is interposed between chip 102-1 and planarization layer 146. Said another way, microlenses 148 are formed in a plane that is parallel to an upper surface of semiconductor substrate 104-1. Opaque layer 144 is interposed between the plane and the semiconductor substrate 104-1. Forming opaque layer 144 under planarization layer 146 obviates the need for additional encapsulation to protect opaque layer 144, as planarization layer 146 effectively encapsulates the opaque layer 144 and prevents peeling of the opaque layer.

During manufacturing, scribe region 134 may ultimately be removed from the image sensor by cutting along the border (sometimes referred to as a scribe line) between bond pad region 132 and scribe region 134.

The foregoing is merely illustrative and various modifications can be made to the described embodiments. The foregoing embodiments may be implemented individually or in any combination.

What is claimed is:

1. An image sensor with an array of imaging pixels, the image sensor comprising:
   a semiconductor substrate;
   photosensitive elements for the array of imaging pixels in the semiconductor substrate;
   color filter elements that overlap the photosensitive elements;
   at least one additional photosensitive element in the semiconductor substrate outside of the array of imaging pixels;
   a conductive light shield that overlaps the at least one additional photosensitive element;
   an opaque dielectric layer that overlaps the conductive light shield and the at least one additional photosensitive element;
   a planarization layer that overlaps both the color filter elements and the opaque layer; and
   microlenses that overlap the color filter elements, wherein the planarization layer is interposed between the color filter elements and the microlenses.

2. The image sensor defined in claim 1, wherein the planarization layer is in direct contact with both the color filter elements and the opaque dielectric layer.

3. The image sensor defined in claim 1, wherein the microlenses are formed in a plane and wherein both the color filter elements and the opaque dielectric layer are interposed between the plane and the semiconductor substrate.

4. The image sensor defined in claim 1, wherein the conductive light shield has a transparency that is less than 20%.

5. The image sensor defined in claim 4, wherein the opaque dielectric layer has a reflectance that is less than 20%.

6. The image sensor defined in claim 4, wherein the conductive light shield comprises a layer of tungsten and a layer of titanium nitride.

7. The image sensor defined in claim 1, further comprising:
   a first chip that includes the first semiconductor substrate;
   a second chip that is bonded to the first chip; and
   a bond pad in the second chip.

8. The image sensor defined in claim 7, further comprising:
   an anti-reflective layer that is formed over the microlenses.

9. The image sensor defined in claim 8, wherein the bond pad is exposed through a trench in the first chip and wherein the anti-reflective layer extends into the trench.

10. The image sensor defined in claim 9, wherein the anti-reflective layer has a first thickness over the microlenses and a second thickness that is less than the first thickness along sidewalls of the trench.

11. The image sensor defined in claim 1, wherein the planarization layer has a first portion with a first upper surface portion that overlaps the color filter elements and a second portion with a second upper surface portion that overlaps the opaque dielectric layer, wherein the first and second upper surface portions are coplanar, and wherein the first and second portions of the planarization layer are formed from the same material.

12. An image sensor with an array of imaging pixels, the image sensor comprising:

a first chip with a first semiconductor substrate;

photosensitive elements for the array of imaging pixels in the first semiconductor substrate;

a second chip with a second semiconductor substrate, wherein the second chip is bonded to the first chip;

a bond pad in the second chip that is exposed through a trench extending through the first chip; and an anti-reflective layer with a first portion that has a first thickness and a second portion that has a second thickness that is less than the first thickness, wherein the first portion overlaps the photosensitive elements.

13. The image sensor defined in claim 12, wherein the second portion is along sidewalls of the trench.

14. The image sensor defined in claim 12, wherein the second portion is in a periphery of the image sensor outside of the array of imaging pixels.

15. The image sensor defined in claim 12, further comprising:

color filter elements that overlap the photosensitive elements;

at least one additional photosensitive element in the first semiconductor substrate outside of the array of imaging pixels;

a conductive light shield that overlaps the at least one additional photosensitive element; and an opaque layer that overlaps the conductive light shield.

16. The image sensor defined in claim 15, further comprising:

microlenses formed in a plane, wherein both the color filter elements and the opaque layer are interposed between the plane and the first semiconductor substrate.

17. The image sensor defined in claim 12, wherein the anti-reflective layer comprises silicon dioxide.

18. The image sensor defined in claim 12, further comprising:

microlenses that overlap the photosensitive elements, wherein the microlenses are interposed between the first portion and the photosensitive elements.

19. The image sensor defined in claim 12, wherein the first chip includes one or more dielectric layers interposed between the semiconductor substrate and the second chip, wherein the trench has a first width in the semiconductor substrate, and wherein the trench has a second width that is less than the first width in the one or more dielectric layers.

20. The image sensor defined in claim 19, wherein the anti-reflective layer has a third portion with the first thickness along an upper surface of the one or more dielectric layers.

* * * * *